(12) United States Patent
Sasaki et al.

(10) Patent No.: US 8,305,147 B2
(45) Date of Patent: Nov. 6, 2012

(54) POWER AMPLIFIER

(75) Inventors: Tadahiro Sasaki, Tokyo (JP); Kazuhide Abe, Kanagawa (JP); Kazuhiko Itaya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,591

(22) Filed: Mar. 20, 2012

(65) Prior Publication Data

US 2012/0200357 A1 Aug. 9, 2012

Related U.S. Application Data

(63) Continuation of application No. PCT/JP2009/004965, filed on Sep. 29, 2009.

(51) Int. Cl.
*H03F 3/14* (2006.01)
(52) U.S. Cl. .................... 330/307; 330/277
(58) Field of Classification Search .............. 330/307, 330/277, 295, 124 R, 286, 84
See application file for complete search history.

(56) References Cited

U.S. PATENT DOCUMENTS

| 5,852,315 | A | 12/1998 | Ker et al. |
| 7,508,268 | B2 * | 3/2009 | Sasaki et al. ............... 330/295 |
| 7,851,833 | B2 * | 12/2010 | Abe et al. ............... 257/288 |
| 2003/0234427 | A1 | 12/2003 | Kono |
| 2004/0140511 | A1 | 7/2004 | Nakatani et al. |
| 2008/0061871 | A1 | 3/2008 | Abe et al. |
| 2008/0099857 | A1 | 5/2008 | Furuta et al. |
| 2008/0238550 | A1 | 10/2008 | Sasaki et al. |
| 2008/0258815 | A1 | 10/2008 | Abe et al. |
| 2009/0134430 | A1 | 5/2009 | Abe et al. |
| 2009/0243725 | A1 | 10/2009 | Abe et al. |

FOREIGN PATENT DOCUMENTS

| JP | 2004-031411 | 1/2004 |
| JP | 2004-179648 | 6/2004 |
| JP | 2006-094557 | 4/2006 |
| JP | 2007-035919 | 2/2007 |

OTHER PUBLICATIONS

International Search Report for International Application No. PCT/JP2009/004965 mailed on Nov. 10, 2009.

* cited by examiner

*Primary Examiner* — Hieu Nguyen
(74) *Attorney, Agent, or Firm* — Turocy & Watson, LLP (57) ABSTRACT

A power amplifier according to the embodiments includes: a silicon substrate; an input terminal configured to receive an input of a RF signal; a power dividing unit configured to divide the RF signal into a first signal and a second signal; a phase modulating unit configured to modulate a phase of the second signal; an N well formed in the silicon substrate; a P well formed in the N well and configured to receive an input of the second signal of a modulated phase; a gate insulating film formed on the P well; a gate electrode formed on the gate insulating film and configured to receive an input of the first signal; source and drain electrodes formed on both sides of the gate electrode in the silicon substrate; and an output terminal configured to output a RF signal obtained from the drain electrode.

5 Claims, 11 Drawing Sheets

POWER AMPLIFIER

CROSS-REFERENCE TO RELATED APPLICATION

This application is continuation application based upon the International Application PCT/JP2009/004965, the International Filing Date of which is Sep. 29, 2009, the entire content of which is incorporated herein by reference.

FIELD

Embodiments described herein relate generally to a power amplifier using a silicon semiconductor.

BACKGROUND

To realize a power amplifier using a MISFET formed on a silicon semiconductor, it is indispensable to stably flow a large current. Hence, a layout is widely used which arranges gates in a comb shape, which is a repetitive pattern of source electrodes, gate electrodes and drain electrodes and which shares the source electrodes and the drain electrodes between adjacent gates. This layout is generally referred to as a "multi-finger structure".

The multi-finger structure causes a negative resistance component of an output from the drain electrode, and has a problem of an unstable RF operation due to this negative resistance component.

DETAILED DESCRIPTION

A power amplifier according to the embodiments includes: a silicon substrate; an input terminal configured to receive an input of a RF signal; a power dividing unit configured to divide the RF signal into a first signal and a second signal; a phase modulating unit configured to modulate a phase of the second signal; an N well formed in the silicon substrate; a P well formed in the N well and configured to receive an input of the second signal of a modulated phase; a gate insulating film formed on the P well; a gate electrode formed on the gate insulating film and configured to receive an input of the first signal; source and drain electrodes formed on both sides of the gate electrode in the silicon substrate; and an output terminal configured to output a RF signal obtained from the drain electrode.

Hereinafter, embodiments will be described referring to the accompanying drawings.

(First Embodiment)

A power amplifier according to the embodiment has: a silicon substrate; an input terminal configured to receive an input of a RF signal; a power dividing unit configured to divide the RF signal into a first signal and a second signal; a phase modulating unit configured to modulate a phase of the second signal; an N well formed in the silicon substrate; a P well formed in the N well and configured to receive an input of the second signal of a modulated phase; a gate insulating film formed on the P well; a gate electrode formed on the gate insulating film and configured to receive an input of the first signal; source and drain electrodes formed on both sides of the gate electrode in the silicon substrate; and an output terminal configured to output a RF signal obtained from the drain electrode.

The power amplifier according to the embodiment employs the above configuration to modulate part of the RF signal which is an input signal, and apply the signal to the P well. By this means, it is possible to compensate for modulation of an output signal produced by an operation of a parasitic bipolar transistor of the power amplifier, and suppress an unstable RF operation caused by a negative resistance component.

Figure 1:
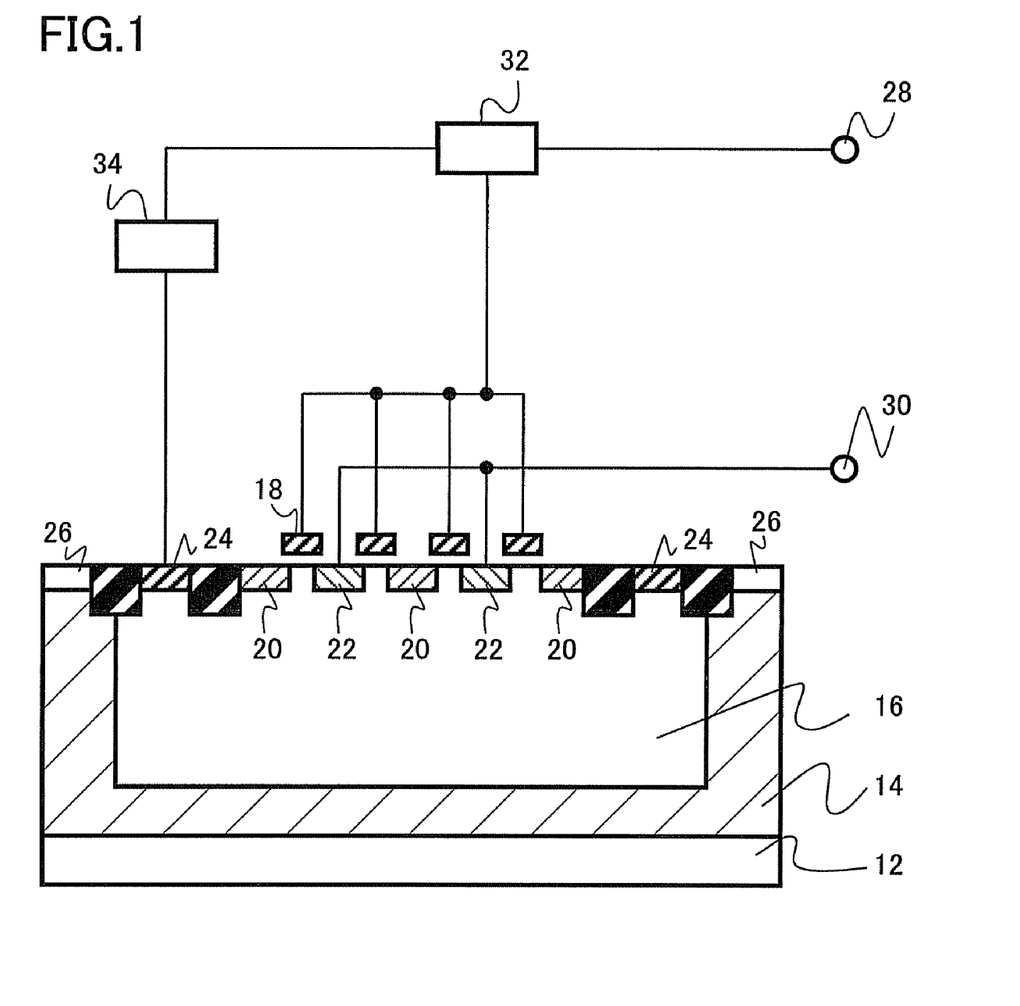
FIG. 1 is a block diagram illustrating a configuration of a power amplifier according to a first embodiment.

FIG. 1 is a block diagram illustrating a configuration of the power amplifier according to the embodiment. The power amplifier according to the embodiment adopts a multi-finger structure.

As illustrated in FIG. 1, the power amplifier according to the embodiment is formed on, for example, a p-type silicon substrate 12. Further, an N well 14 doped with an n-type impurity is formed in this silicon substrate 12

Furthermore, a P well 16 formed in the N well 14 and doped with a p-type impurity is formed. Still further, a MOSFET of a multi-finger layout is formed on this P well 16. This MOSFET has a gate insulating film (not illustrated) formed on the P well 16, and gate electrodes 18 formed on the gate insulating film. Moreover, source electrodes 20 and drain electrodes 22 formed on both sides of the gate electrodes 18 in the silicon substrate 12.

Further, P well electrodes 24 for applying potentials to the P well are formed on the P well 16. Furthermore, N well electrodes 26 for applying potentials to the N well are formed on the N well 14.

Still further, the power amplifier has an input terminal 28 which receives an input of a RF signal which is an input signal of the power amplifier, and an output terminal 30 which outputs the RF signal which is obtained from the drain electrode 22 and is an output signal of the power amplifier.

Moreover, the power amplifier has a power dividing unit 32 which divides the RF signal input to the input terminal 28, into a first signal and a second signal, and a phase modulating unit 34 which modulates the phase of the divided second signal.

The second signal modulated by the phase modulating unit 34 is input to the P well 16 through the P well electrode 24. Meanwhile, the phase is modulated such that the output signal output from the output terminal 30 does not show unstable characteristics such as a negative resistance. In addition, the divided first signal is input to the gate electrodes 18.

In addition, although FIG. 1 does not illustrate peripheral circuits provided in the silicon substrate 12, for example, a P well which is separate from the P well 16 and an N well which is separate from the N well 14 may be provided outside the N well 14 in FIG. 1 to provide peripheral circuits formed with CMOS'. In this case, a RF signal is not input to and a fixed bias voltage is applied to the P well which is separate from the P well 16. Further, a fixed bias voltage which is the same as or different from the N well 14 is applied to the N well which is separate from the N well 14.

Figure 2:
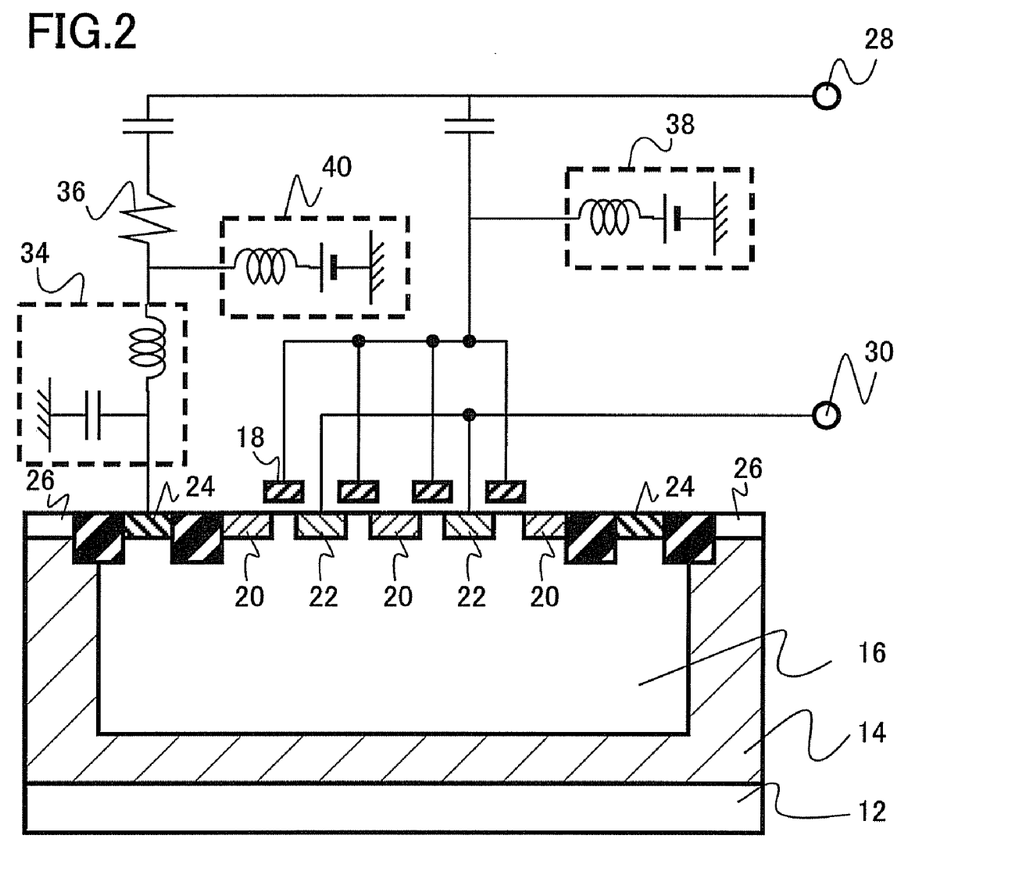
FIG. 2 is a view illustrating a circuit configuration of the power amplifier according to the first embodiment.

FIG. 2 is a view illustrating a circuit configuration of the power amplifier according to the embodiment. FIG. 2 specifically illustrates the circuit configuration of the power amplifier in FIG. 1. The RF signal input from the input terminal 28 is distributed at a desired ratio by branching a wiring and providing a resistance 36 on one of the branched wirings. For example, 99% of input power is distributed to the first signal, and 1% is distributed to the second signal. This ratio is set to a desired value taking suppression of unstability and power loss into account.

The first signal input to the gate electrode 18 is configured to be applied with a predetermined bias voltage from a MOS bias power source 38. Further, the first signal input to the P well 16 is configured to be applied with a predetermined bias voltage from a P well bias power source 40.

Furthermore, on a route between the input terminal 28 and the P well electrode 24, a phase modulator 34 formed with an inductor and a capacitor is arranged.

In addition, the power dividing unit 32 and the phase modulating unit 34 are not necessarily limited to the circuit configuration in FIG. 2. In addition, it is possible to employ a configuration which adopts a known power dividing method and a phase modulating method.

Figure 3:
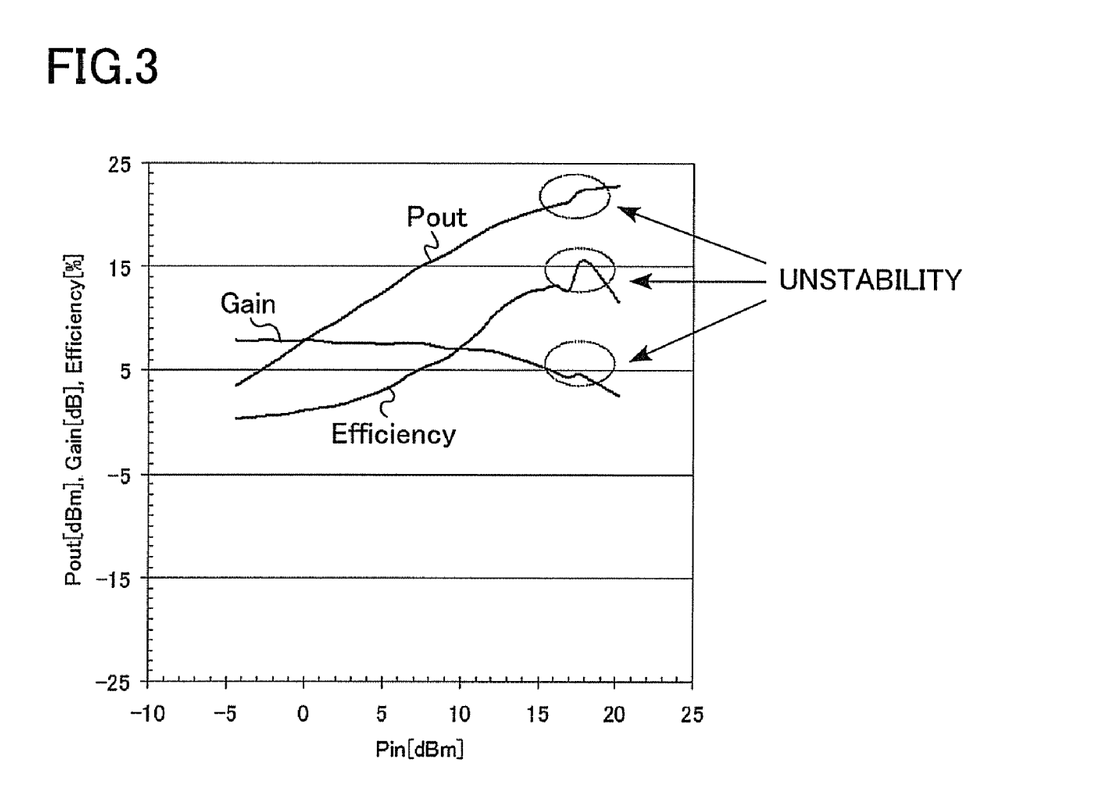
FIG. 3 illustrates an evaluation result of a test pattern of a power amplifier having a MISFET of a multi-finger structure.

Next, a conventional problem and an effect according to the embodiment will be described. FIG. 3 illustrates an evaluation result of a test pattern of the power amplifier having the MOSFET of the multi-finger structure. This test pattern adopts the multi-finger structure in which a gate electrode of the MISFET of a gate width of 3200 μm is divided into eight comb shapes. Further, divided gate electrodes are arranged in eight independent P wells formed in the N well.

With FIG. 3, the horizontal axis indicates input power (Pin), and the vertical axis indicates output power (Pout), a gain (Gain) and an amplification efficiency (Efficiency). As illustrated in FIG. 3, an unstable RF operation appears as a kink phenomenon in the output power, the gain and the amplification efficiency in a region closer to saturated power at which the output power is saturated with respect to the input power. In addition, measurement is performed at the frequency of about 2.5 GHz.

A mechanism of causing unstability as illustrated in FIG. 3 is supposed to be caused by a hot carrier due to a high electrical field applied between a source and a drain of the MOSFET likewise in terms of RF and DC. That is, impact ionization is promoted at a drain electrode end due to a high electrical field applied between the source and the drain, and many electrons which are hot carriers and holes (positive holes) are ejected, thereby causing unstable performance.

Figure 4:
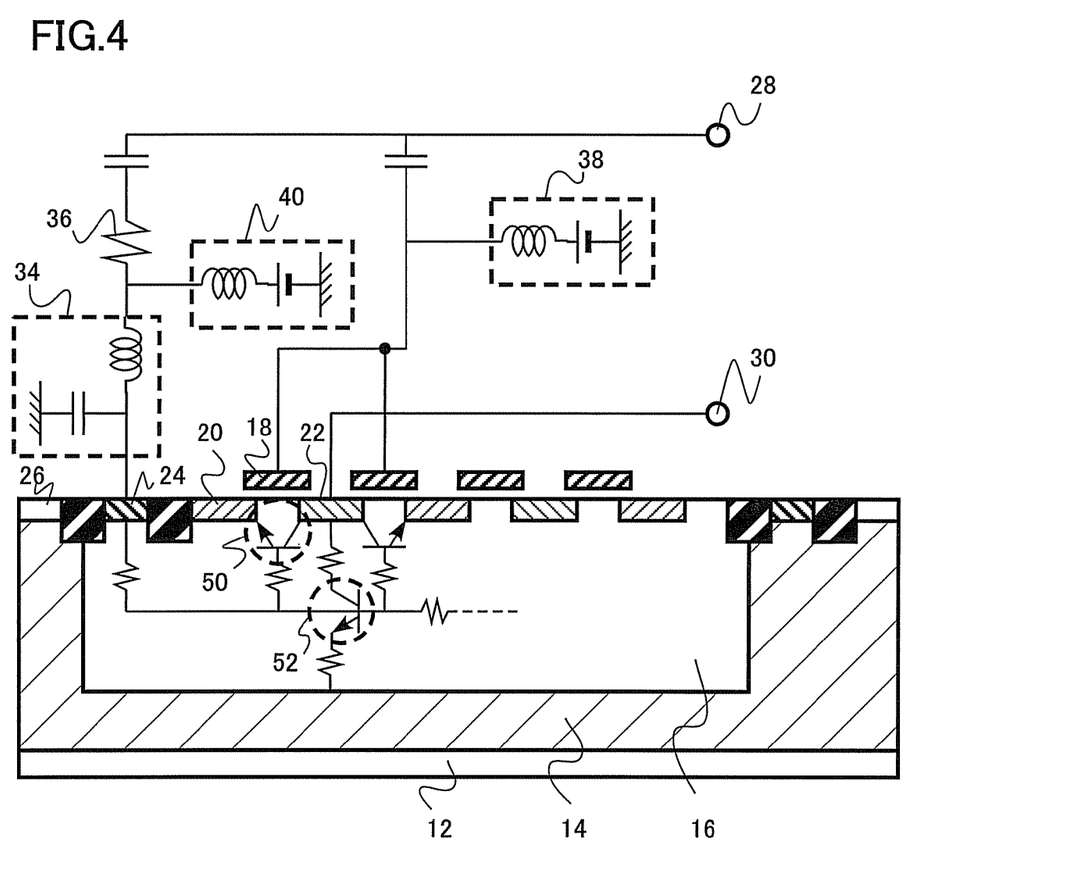
FIG. 4 is an explanatory diagram of a parasitic bipolar transistor of the power amplifier.

FIG. 4 is an explanatory diagram of a parasitic bipolar transistor of the power amplifier. The inventors of this application thought that the unstability of the power amplifier is caused by the operation of the parasitic bipolar transistor, and investigated this cause. As illustrated in FIG. 4, a conventional power amplifier and the power amplifier according to the embodiment have a first parasitic bipolar transistor 50 which uses the source electrodes 20 as emitters, the drain electrodes 22 as collectors and the P well electrodes 24 as bases, and a second parasitic bipolar transistor 52 which uses the N well electrodes 26 as emitters, the drain electrodes 22 as collectors and the P well electrodes 24 as bases.

A carrier produced by impact ionization becomes a base current of each parasitic bipolar transistor. Further, currents produced by both of the first parasitic bipolar transistor 50 and the second parasitic bipolar transistor 52 are added to a drain current of the MOSFET and output.

Figure 5:
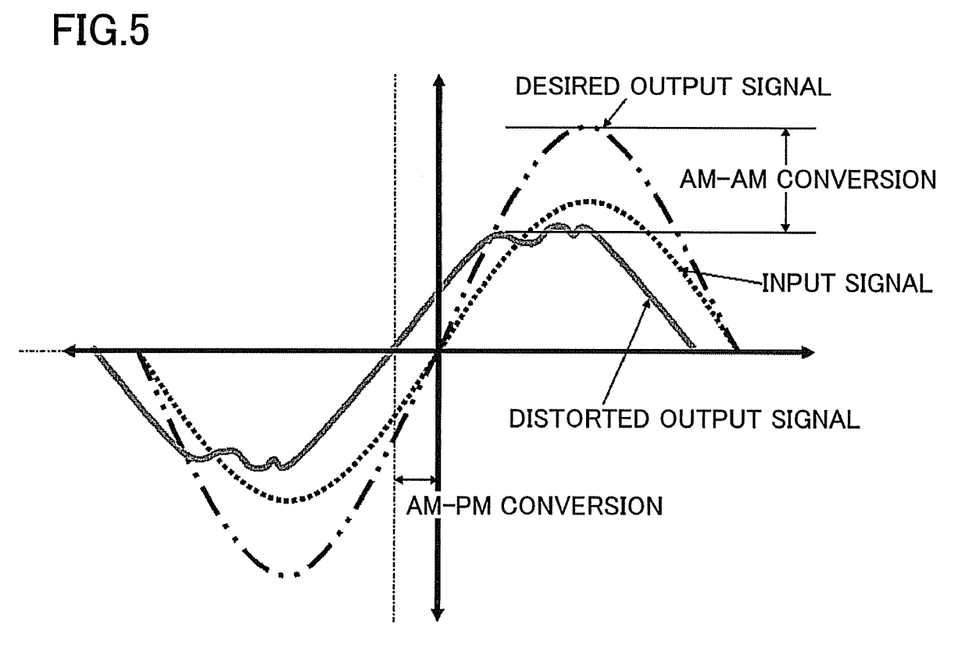
FIG. 5 is an explanatory view of AM-PM conversion and AM-AM conversion.

FIG. 5 is an explanatory view of AM-PM conversion and AM-AM conversion. AM-PM conversion and AM-AM conversion mean a difference of an actually distorted output signal with respect to a desired output signal, that is, an ideal output signal when a RF signal of a fixed frequency is input to the power amplifier. As illustrated in FIG. 5, AM-PM conversion means a phase difference, and AM-AM conversion means an amplitude difference. The inventors of this application think that performance of the power amplifier becomes unstable due to AM-PM conversion and AM-AM conversion performed in the first parasitic bipolar transistor 50 and the second parasitic bipolar transistor 52. Particularly, AM-AM conversion which represents the amplitude difference is a main factor of unstability.

Figure 6A:
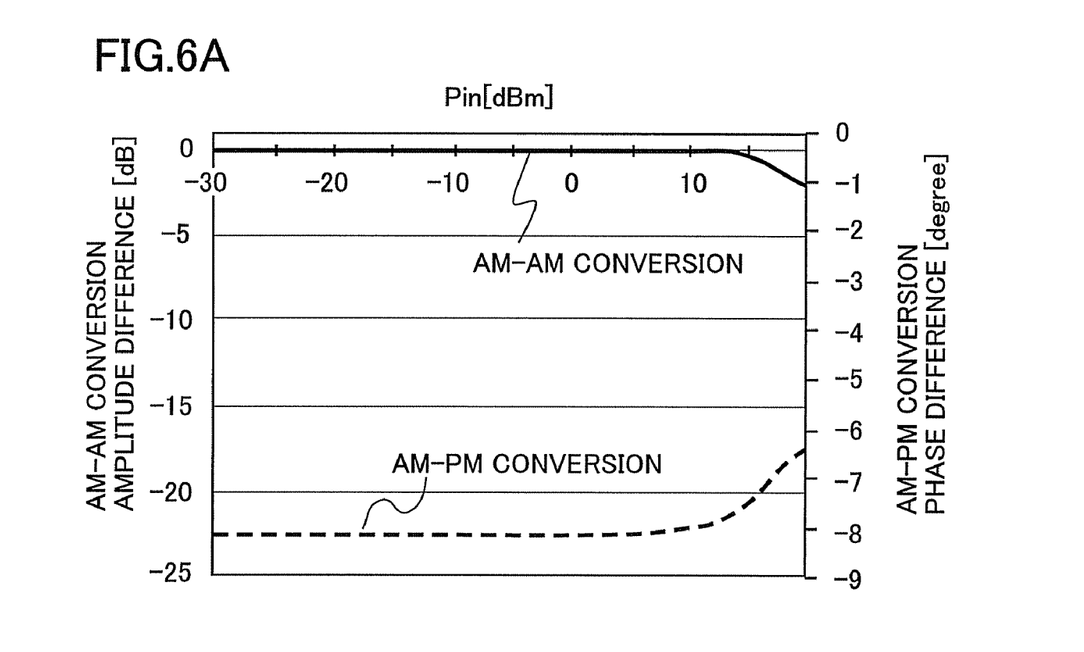
FIGS. 6A and 6B are views illustrating simulation results of a conventional power amplifier.
Figure 6B:
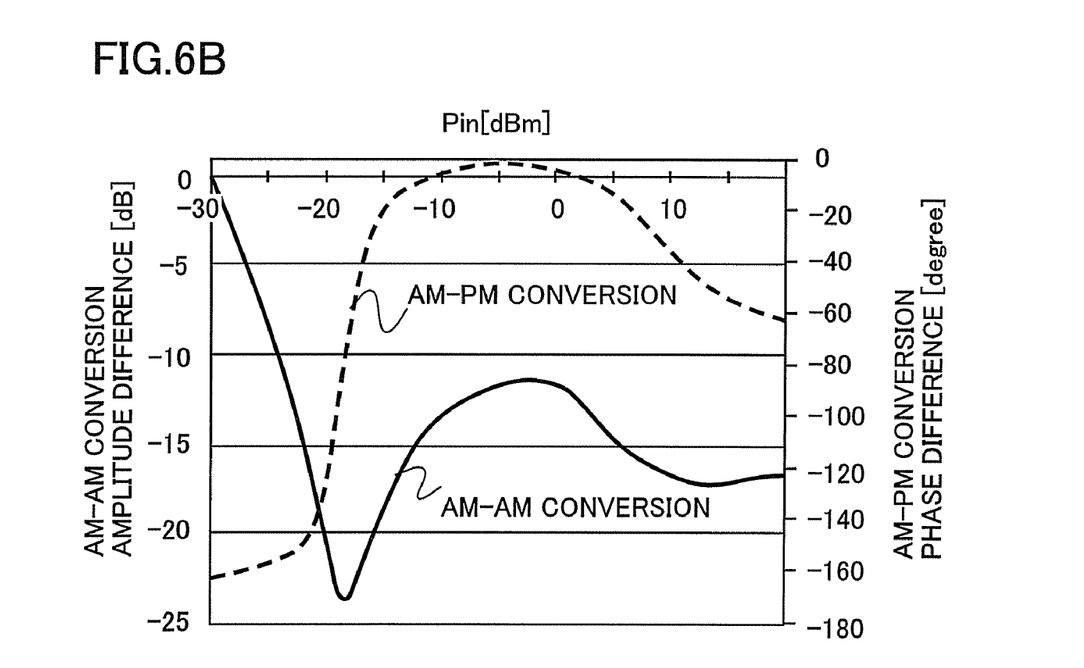
Figure 7:
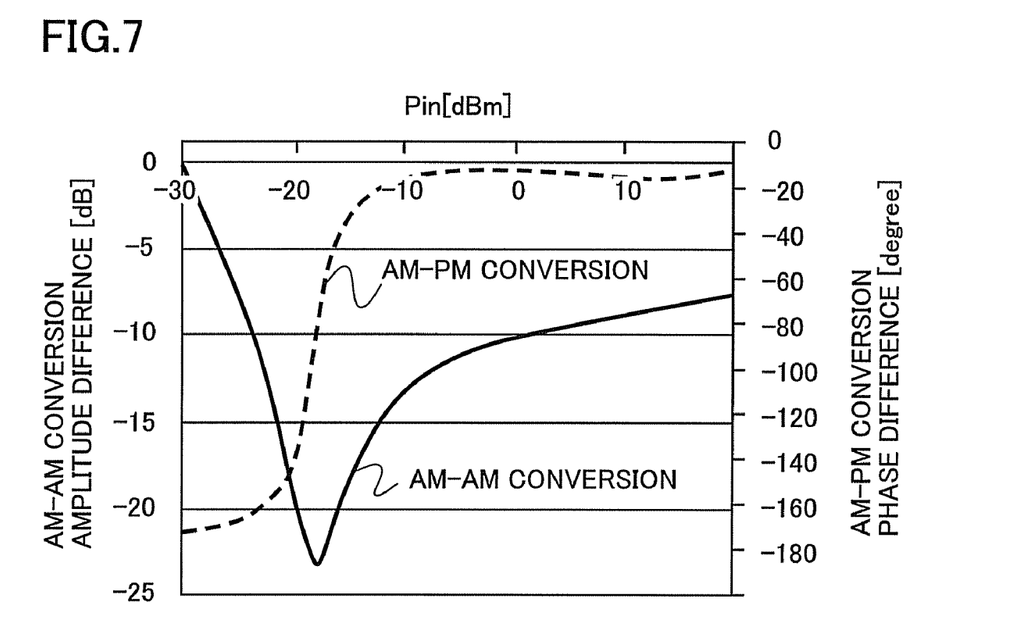
FIG. 7 is a view illustrating a simulation result of the conventional power amplifier.

FIGS. 6A and 6B and FIG. 7 are views illustrating simulation results of the conventional power amplifier. FIG. 6A is a view illustrating AM-AM conversion and AM-PM conversion of the MOSFET alone, and FIG. 6B is a view illustrating AM-AM conversion and AM-PM conversion of a parasitic bipolar transistor alone. Simulation is executed using a circuit excluding a configuration of dividing a RF signal according to the embodiment from an equivalent circuit illustrated in FIG. 4. While the MOSFET portion shows a stable operation, the parasitic bipolar transistor portion shows an unstable operation.

FIG. 7 is a view illustrating a simulation result by combining both of the MOSFET portion and the parasitic bipolar portion in FIGS. 6A and 6B. Thus, with the conventional power amplifier, unstable performance of the parasitic bipolar transistor portion is added to normal performance of the MOSFET portion, thereby causing an unstable operation as a whole.

The power amplifier according to the embodiment modulates part of the RF signal which is the input signal, and applies the signal to the P well which is the base of a parasitic bipolar transistor. In this case, the phase of the RF signal to be applied to the P well is modulated such that, particularly, AM-AM conversion is compensated for, that is, AM-AM conversion is suppressed.

Figure 8:
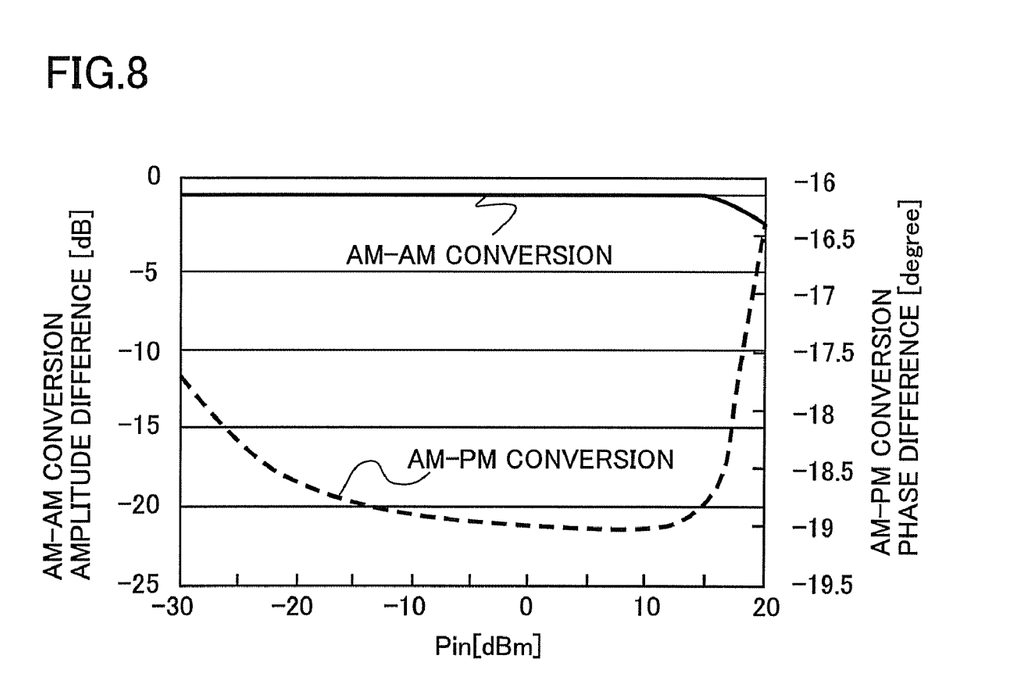
FIG. 8 is a view illustrating a simulation result of the power amplifier according to the first embodiment.

FIG. 8 is a view illustrating a simulation result of the power amplifier according to the embodiment. Simulation is executed using the equivalent circuit illustrated in FIG. 4. According this simulation, outputs of both of the MOSFET portion and the parasitic bipolar transistor portion are added. As is obvious from FIG. 8, an unstable operation which conventionally occurs is suppressed. Particularly, the amplitude difference resulting from the AM-AM conversion becomes almost zero, and is close to an ideal output signal.

Figure 9A:
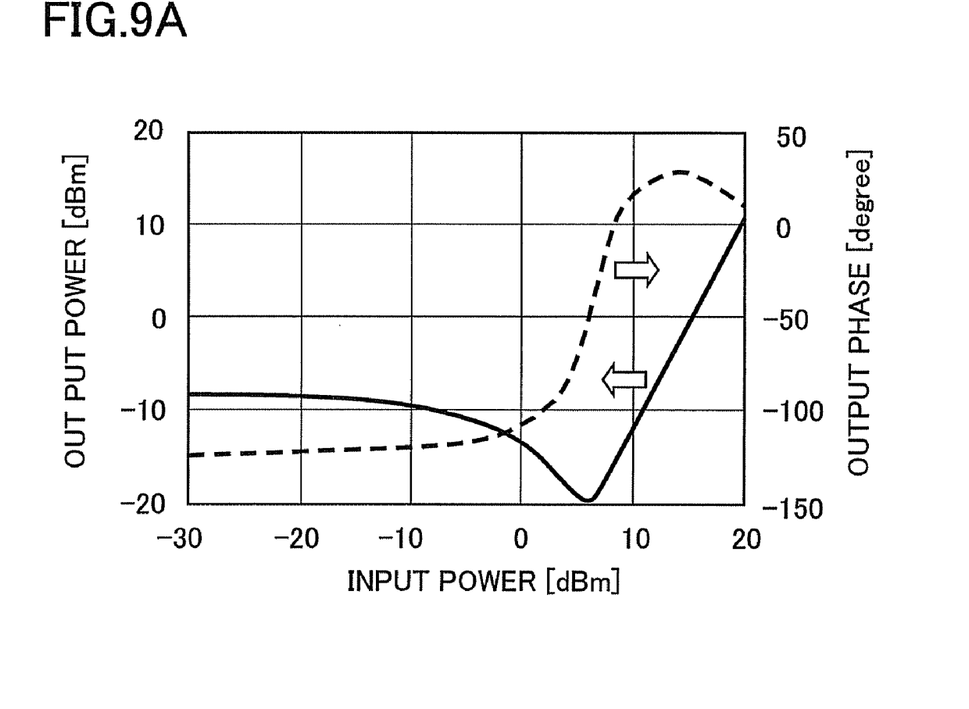
FIGS. 9A and 9B are views illustrating simulation results of the conventional power amplifier and the power amplifier according to the first embodiment.
Figure 9B:
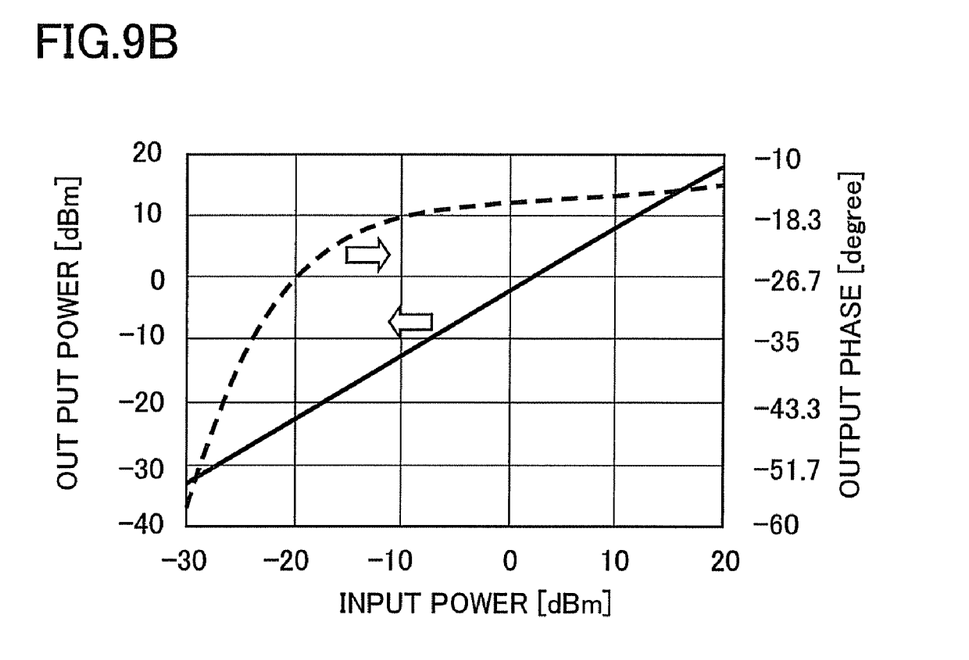

FIGS. 9A and 9B are views illustrating simulation results of the conventional power amplifier and the power amplifier according to the embodiment. FIG. 9A illustrates a case of the conventional power amplifier, and FIG. 9B illustrates a case of the power amplifier according to the embodiment. Simulation is executed using the equivalent circuit illustrated in FIG. 4. Meanwhile, simulation is executed in FIG. 9A using a circuit excluding the configuration of dividing the RF signal according to the embodiment. The horizontal axis indicates input power, and the vertical axis indicates output power and an output phase. As is clear from FIGS. 9A and 9B, with the embodiment, it is possible to secure linearity of input power and output power, and suppress unstability which is conventionally observed.

Thus, with the embodiment, by actively controlling and operating the parasitic bipolar transistor which is conventionally a factor of an unstable operation, it is possible to overcome the unstable operation. Consequently, with the embodiment, it is possible to provide the power amplifier which suppresses an unstable RF operation occurring in the power amplifier having the MISFET, and operates stably even upon a large output.

(Second Embodiment)

With a power amplifier according to the embodiment, a gate electrode adopts an annular structure, a drain electrode and a P well electrode are formed in order toward an inside of the gate electrode, and a source electrode is formed outside the gate electrode.

Figure 10A:
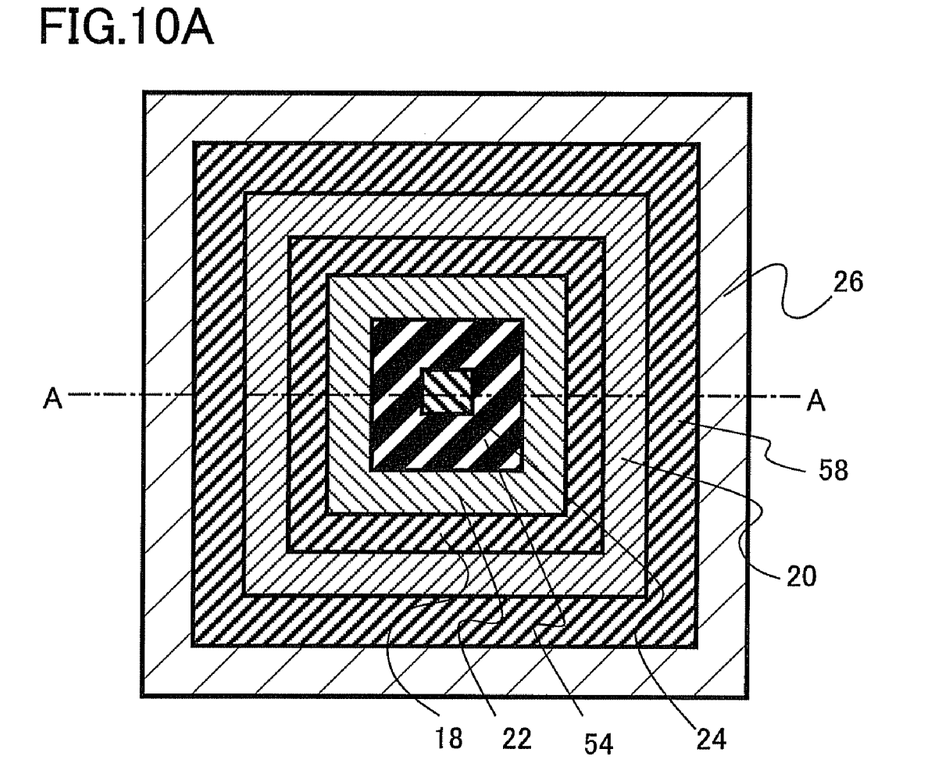
FIGS. 10A and 10B are views illustrating a configuration of a power amplifier according to a second embodiment.
Figure 10B:
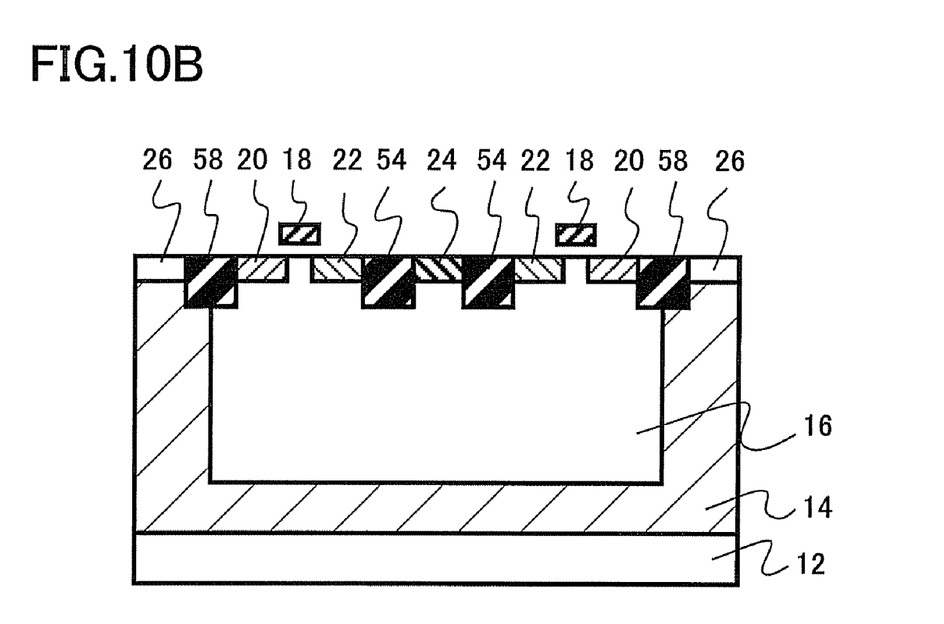

FIGS. 10A and 10B are views illustrating a configuration of a power amplifier according to the embodiment. FIG. 10A is a plan view, and FIG. 10B is an AA section view of FIG. 10A.

With the power amplifier according to the embodiment, a gate electrode 18 adopts a square annular structure on a silicon substrate 12. Further, a drain electrode 22 and a P well electrode 24 which applies the potential to a P well 16 are formed in order toward an inside of the gate electrode 18. Further, a source electrode 20 is formed outside the gate electrode.

Thus, features of the power amplifier according to the embodiment include that electrodes of a P well electrode 24 in the center to the source electrode 20 on the outer side are arranged like a growth ring of a tree. This layout is referred to as a "growth ring gate structure".

Further, a first element isolating region 54 is formed between the drain electrode 22 and the P well electrode 24. Further, an N well electrode 26 which applies the potential to the N well 14 through a second element isolating region 58 is arranged around the source electrode 20.

Meanwhile, while the layout of only one growth ring gate structure has been illustrated, it is possible to realize the power amplifier which can further amplify large power by, for example, arranging in parallel a plurality of the growth ring gate structures illustrated in FIG. 10A as basic cells.

As in the embodiment, by providing the P well electrode 24 near the drain electrode 22 at which a hot carrier is produced by impact ionization and inside the drain electrode 22, a hot carrier is sucked efficiently. Particularly when a plurality of basic cells having this growth ring gate structure are arranged, it is possible to prevent a hot carrier from flowing outside a cell, that is, to an adjacent cell by sucking the hot carrier inside the cell. Consequently, it is possible to suppress an influence of a hot carrier on an operation of an adjacent cell, and reduce an unstable RF operation. Consequently, it is possible to realize the power amplifier which stably operates even upon a large output.

Further, by simply providing a two-dimensional arrangement of the growth ring gate structures according to the embodiment, it is possible to increase a total gate length, and provide a layout of the power amplifier for large power having a desired size. Consequently, it is possible to provide an advantage of facilitating a pattern layout upon design of the power amplifier for large power.

Further, the layout of the growth ring gate structures is simplified with higher pattern symmetry than the multi-finger layout, so that it is also possible to simplify an equivalent circuit. Consequently, it is possible to easily and accurately realize operation simulation of the power amplifier. Consequently, it is possible to simply realize the power amplifier of high performance.

Although the square annular structure has been described as an example, the square annular structure is desirable in view of easiness of the layout. However, for example, circular, triangular and other polygonal annular structures may be adopted.

In addition, although FIGS. 10A and 10B do not illustrate peripheral circuits provided in the silicon substrate 12, a P well which is separate from the P well 16 and an N well which is separate from the N well 14 may be provided outside the N well 14 in FIG. 1 to provide peripheral circuits formed with CMOS'.

(Third Embodiment)

With a power amplifier according to the embodiment, a plurality of cells are arranged using a cell as a basic cell described in the second embodiment in which a gate electrode adopts an annular structure, a drain electrode and a P well electrode are formed in order toward an inside of the gate electrode, and a source electrode is formed outside the gate electrode. Further, all of a plurality of these cells have a similar figure to the basic cell, and have at least two or more different sizes.

Figure 11:
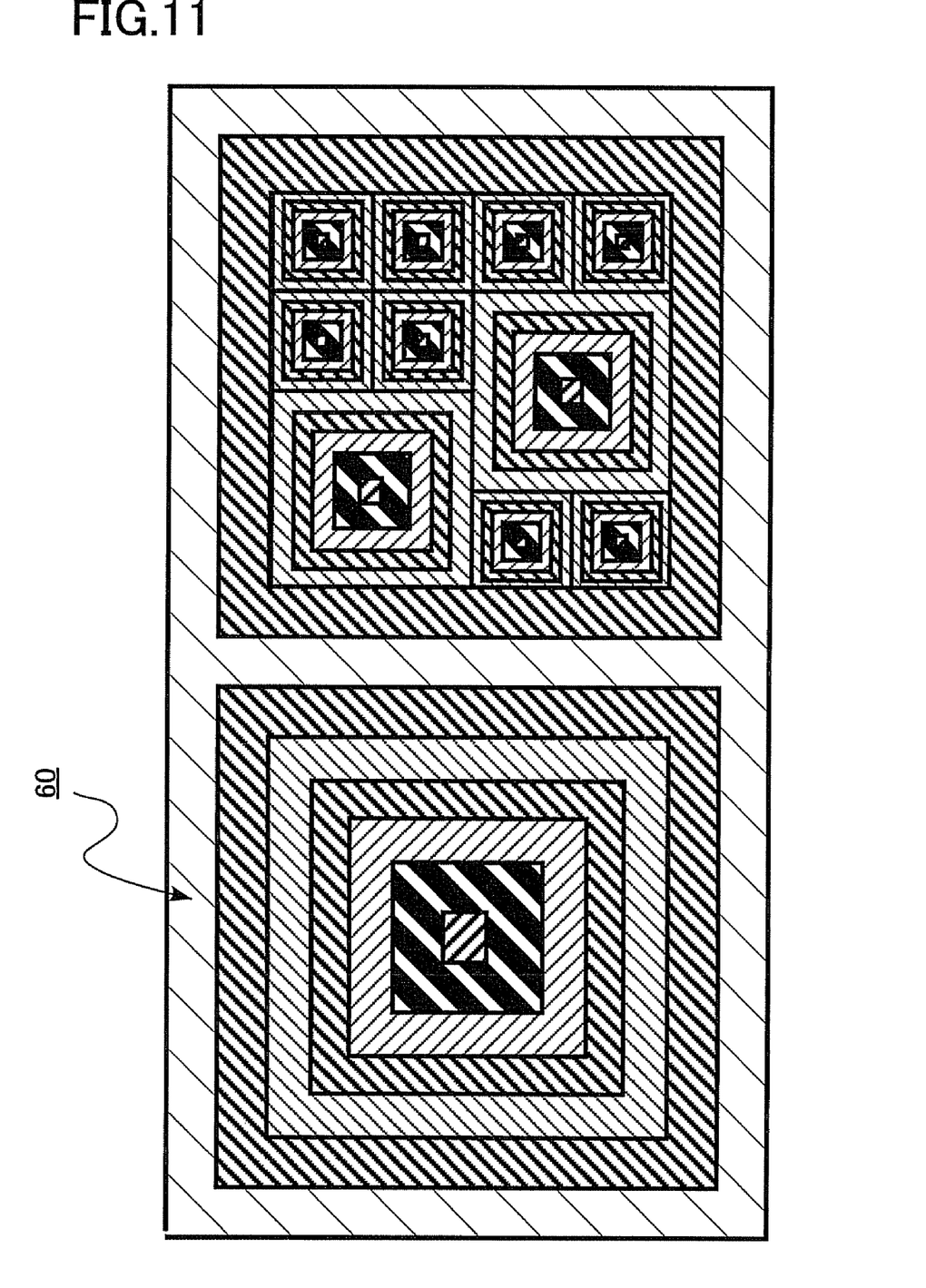
FIG. 11 is a view illustrating a layout of a power amplifier according to a third embodiment.

The structure illustrated in FIGS. 10A and 10B is the basic cell according to the embodiment. FIG. 11 is a view illustrating an example of a layout of the power amplifier according to the embodiment.

With a basic cell 60 according to the embodiment, a gate electrode 18 adopts a square annular structure on a silicon substrate 12. Further, a drain electrode 22 and a P well electrode 24 which applies the potential to a P well 16 are formed in order toward an inside of the gate electrode 18. Furthermore, a source electrode 20 is formed outside the gate electrode.

Thus, features of the basic cell according to the embodiment include that electrodes of a P well electrode 24 in the center to the source electrode 20 on the outer side are arranged like a growth ring of a tree. This layout of the basic cell is referred to as a "growth ring gate structure".

Further, a first element isolating region 54 is formed between the drain electrode 22 and the P well electrode 24. Furthermore, an N well electrode 26 which applies the potential to the N well 14 through a second element isolating region 58 is arranged around the source electrode 20.

As illustrated in FIG. 11, a plurality of cells of different sizes having a similar figure to the basic cell 60 in FIGS. 10A and 10B are arranged. These cells are arranged in a mosaic pattern. Thus, it is desirable to arrange the cells in the mosaic pattern from the view point of further reducing regularity of the layout.

Further, although the square annular structure has been described here as an example, the square annular structure is desirable in view of easiness of the layout.

However, for example, circular, triangular and other polygonal annular structures may be adopted.

With the power amplifier adopting a multi-finger structure or a waffle gate structure, gate electrodes, source electrodes and drain electrodes are regularly arranged. Hence, a mutual interference is considered to occur between gates due to phonon energy, thereby promoting impact ionization. Therefore, an unstable RF operation is accelerated.

That is, phonon energy produced by impact ionization upon a MOSFET operation is reflected by, for example, an end of an element isolating region, thereby causing a mutual interference and producing a standing wave upon lattice vibration of silicon. Further, a model is considered in which this standing wave increases lattice vibration in a channel region of the MOSFET, and impact ionization is further accelerated. When this standing wave has higher periodicity of the layout pattern, an interference of waves is more likely to occur.

By arranging cells of different sizes having a similar figure to the basic cell as in the embodiment, the periodicity of the layout is reduced. Consequently, it is possible to realize the power amplifier which suppresses a mutual interference between gates due to phonon energy, suppresses an unstable RF operation occurring in the power amplifier having the MISFET, and operates stably even upon a large output.

Further, the power amplifier according to the embodiment is provided in a layout by arranging cells having a similar figure to the basic cell. Consequently, the pattern layout is easy upon design of the power amplifier. Further, cells of different sizes can be arranged, so that there is an advantage of improving flexibility of the pattern layout and designing a more compact power amplifier.

Furthermore, the layout of the growth ring gate structures is simplified with higher pattern symmetry than the multi-finger layout, so that it is also possible to simplify an equivalent circuit. Consequently, it is possible to easily and accurately realize operation simulation of the power amplifier. Consequently, it is possible to simply realize the power amplifier of high performance.

(Fourth Embodiment)

A power amplifier according to the embodiment is the same as in the first embodiment except that a multi-finger structure is changed to a growth ring gate structure according to the second embodiment. Therefore, the contents overlapping the first embodiment and the second embodiment will not be repeated.

Figure 12:
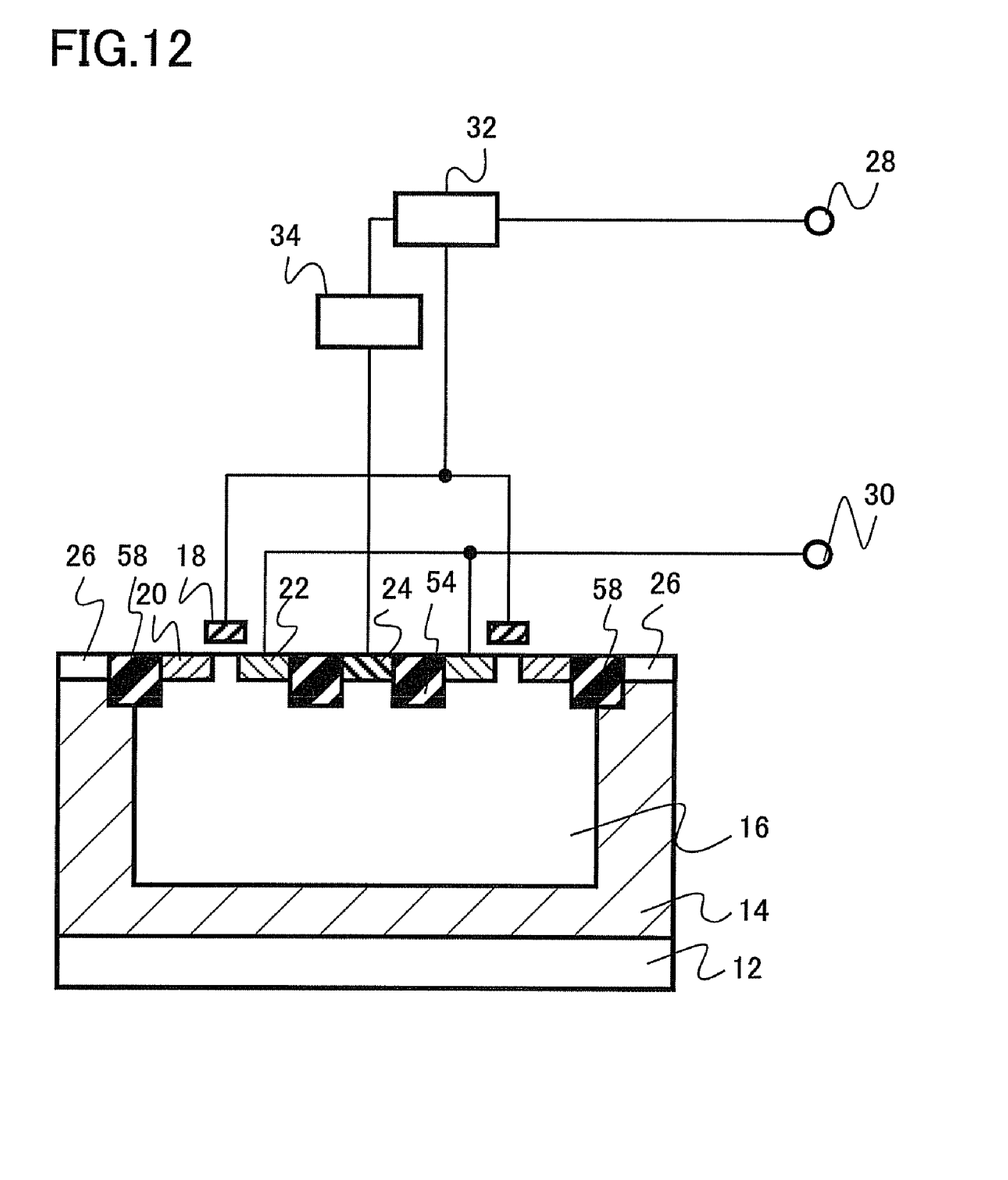
FIG. 12 is a view illustrating a configuration of a power amplifier according to a fourth embodiment.

FIG. 12 is a view illustrating an example of a configuration of the power amplifier according to the embodiment. The power amplifier according to the embodiment provides the same effect as the power amplifiers according to the first and second embodiments.

Further, the growth ring gate structure has more simple equivalent circuits of a MOSFET and parasitic bipolar transistor than the conventional multi-finger structure or the waffle gate structure. Consequently, accurate modeling is possible, and the phase can be easily modulated by the phase modulator 34.

Consequently, it is possible to provide the power amplifier which further suppresses the unstable RF operation occurring in the power amplifier having the MISFET, and operates stably even upon a large output.

In addition, with the embodiment, arranging cells of the growth ring gate structure by changing sizes of the cells as described in the third embodiment is effective to further stabilize the operation. Further, arranging these cells in the mosaic pattern is more effective.

In addition, although FIG. 12 does not illustrate peripheral circuits provided in the silicon substrate 12, for example, a P well which is separate from the P well 16 and an N well which is separate from the N well 14 may be provided outside the N well 14 in FIG. 12 to provide peripheral circuits formed with CMOS'. In this case, a RF signal is not input to and a fixed bias voltage is applied to the P well which is separate from the P well 16. Further, a fixed bias voltage which is the same as or different from the N well 14 is applied to the N well which is separate from the N well 14.

While certain embodiments have been described, these embodiments have been presented by way of example only, and are not intended to limit the scope of the inventions. Indeed, the power amplifier described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A power amplifier comprising:
   a silicon substrate;
   an input terminal receives an input of a RF signal;
   a power dividing unit divides the RF signal into a first signal and a second signal;
   a phase modulating unit modulates a phase of the second signal;
   an N well formed in the silicon substrate;
   a P well formed in the N well and receives an input of the second signal of a modulated phase;
   a gate insulating film formed on the P well;
   a gate electrode formed on the gate insulating film and receives an input of the first signal;
   source and drain electrodes formed on both sides of the gate electrode in the silicon substrate; and
   an output terminal outputs a RF signal obtained from the drain electrode.

2. The power amplifier according to claim 1, wherein the phase modulating unit is formed with an inductor and a capacitor.

3. The power amplifier according to claim 1, wherein the gate electrode having an annular structure, the drain electrode and a P well electrode input the second signal to the P well are formed in order toward an inside of the gate electrode, and the source electrode is formed outside the gate electrode.

4. The power amplifier according to claim 1, wherein a plurality of cells are arranged using a cell as a basic cell in which the gate electrode having an annular structure, the drain electrode and a P well electrode input the second signal to the P well are formed in order toward an inside of the gate electrode, and the source electrode is formed outside the gate electrode, and
   the plurality of cells have a similar figure to the basic cell, and have at least two or more different sizes.

5. The power amplifier according to claim 4, wherein the plurality of cells are arranged in a mosaic pattern.

* * * * *